United States Patent [19]

Nawata et al.

[11] Patent Number: 5,049,628

[45] Date of Patent: Sep. 17, 1991

[54] UNSATURATED GROUP-CONTAINING POLYCARBOXLIC ACID RESIN, RESIN COMPOSITION AND SOLDER RESIST RESIN COMPOSITION COMPRISING THE SAME AND CURED PRODUCT THEREOF

[75] Inventors: Kazuyoshi Nawata, Onoda; Tetsuo Ohkubo, Ube; Minoru Yokoshima, Toride, all of Japan

[73] Assignee: Nippon Kayaku Kabushiki Kaisha, Tokyo, Japan

[21] Appl. No.: 413,470

[22] Filed: Sep. 27, 1989

[30] Foreign Application Priority Data

Oct. 4, 1988 [JP] Japan .................. 63-250682

[51] Int. Cl.$^5$ .............. C08F 283/00; C08G 8/30; C08G 8/28; C08L 61/00
[52] U.S. Cl. .................. 525/502; 525/507; 525/481; 525/533; 528/104
[58] Field of Search .............. 525/502, 507, 481, 533; 528/104

[56] References Cited

U.S. PATENT DOCUMENTS

| | | | |
|---|---|---|---|
| 3,980,483 | 9/1976 | Nishikubo et al. | 96/115 |
| 4,159,285 | 6/1979 | Passalenti et al. | 525/502 |
| 4,390,664 | 6/1983 | Kanayama | 525/507 |
| 4,394,496 | 7/1983 | Schrader | 528/98 |
| 4,672,103 | 6/1987 | Wang et al. | 525/481 |
| 4,895,755 | 1/1990 | Berman et al. | 525/481 |

FOREIGN PATENT DOCUMENTS

| | | | |
|---|---|---|---|
| 0239784 | 10/1987 | European Pat. Off. | 525/507 |
| 2106916 | 5/1987 | Japan | 525/481 |
| 2175908A | 12/1986 | United Kingdom . | |

OTHER PUBLICATIONS

The Chemistry of Phenolic Resins, Robert W. Martin, 1956, p. 99 (J. W. Wiley & Sons).

*Primary Examiner*—John C. Bleutge
*Assistant Examiner*—W. R. H. Clark
*Attorney, Agent, or Firm*—Henry C. Nields

[57] ABSTRACT

The present invention relates to an unsaturated group-containing polycarboxylic acid resin produced by reacting an epoxidized compound of a condensate of a phenolic compound and an aromatic aldehyde having a phenolic hydroxyl group with (meth)acrylic acid, and further reacting the reaction product with polybasic carboxylic acid or an anhydride thereof; a composition comprising the resin and a cured product of the resin or the composition.

The composition according to the present invention is developable with an aqueous alkaline solution and suitable for a solder resist composition which is excellent in heat resistance, solvent resistance, adhesion, electric insulation property and storage stability.

27 Claims, 1 Drawing Sheet

UNSATURATED GROUP-CONTAINING POLYCARBOXLIC ACID RESIN, RESIN COMPOSITION AND SOLDER RESIST RESIN COMPOSITION COMPRISING THE SAME AND CURED PRODUCT THEREOF

BACKGROUND OF THE INVENTION

The present invention relates to an unsaturated group-containing polycarboxylic acid resin, a resin composition comprising such a resin and suitable for a solder resist which can provide a permanent protective film of a printed circuit board excellent in heat resistance, chemical resistance and electric insulation property.

Ultraviolet curing compositions have recently been widely used for the purpose of saving resources and energy, improving the operability and productivity and the like. In the field of processing of printed circuit boards, various conventional inks such as solder resist ink and marking ink have also been changed from thermosetting compositions to ultraviolet curing compositions. Especially, solder resist ink has quickly changed to an ultraviolet curing composition from a conventional thermosetting composition.

Use of such an ultraviolet curing composition, however, is limited to the filed of what is called boards for public use which are used for radio, video, TV set and the like, and the application to the filed of what is called industrial boards which are used for computers, control machines and the like is not yet realized. This is because solder resist ink used for industrial boards is required to have a property such as a high electric insulating property, soldering resistance in a humid atmosphere and plating resistance, and the properties of the present solder resist ink for boards for public use have not reached the required level. With the recent tendency to smaller-sized and more highly-functioned electronic machines, industrial boards have been required to improve the pattern density of the circuit. Screen printing using conventional ultraviolet curing solder resist ink cannot produce satisfactory results due to the limitation of the printing accuracy. The conventional ultraviolet curing solder resist ink contains 1- to 3- functional monomer such as 2-hydroxyethyl methacrylate and trimethylolpropane triacrylate and various acrylate oligomers. During screen printing, these substances tend to bleed out, thereby disadvantageously obstructing soldering. To solve the above-described problems, for example, Japanese Patent Application Laid-Open (KOKAI) No. 60-208377 (1985) proposes a resin composition comprising a photopolymerizable epoxyvinyl ester resin, photopolymerization initiator and an amine epoxy hardener. Although this composition is excellent in heat resistance, adhesion, chemical resistance and electric insulation property, since an amine epoxy hardener is used, the storage stability is poor and an organic solvent must be used for developing images.

As a result of studies undertaken by the present inventors so as to solve these problems, the present inventors have found a resin composition which has a good storage stability, which is developable by an aqueous alkaline solution, which is excellent in heat resistance, adhesion, chemical resistance and electric insulation property and which is suitable for a solder resist. The present invention has been accomplished based on this finding.

SUMMARY OF THE INVENTION

In a first aspect of the present invention, there is provided an unsaturated group-containing polycarboxylic acid resin produced by reacting an epoxidized compound of a condensate of a phenolic compound and an aromatic aldehyde having a phenolic hydroxyl group with (meth)acrylic acid, and further reacting the reaction product with polybasic carboxylic acid or an anhydride thereof.

In a second aspect of the present invention, there is provided a resin composition comprising the unsaturated group-containing polycarboxylic acid resin.

In a third aspect of the present invention, there is provided a solder resist composition comprising the unsaturated group-containing polycarboxylic acid resin.

In a fourth aspect of the present invention, there is provided a cured product of the resin or the composition.

The unsaturated group-containing polycarboxylic acid resin of the present invention is produced by reacting an epoxidized compound, which is obtained by subjecting a condensate of a phenolic compound such as phenol, o-cresol, m-cresol and p-cresol with an aromatic aldehyde having a phenolic hydroxyl group such as hydroxybenzaldehyde and salicylaldehyde to epoxidation with epihalohydrin, with (meth)acrylic acid, and further reacting the reaction product with polybasic carboxylic acid or an anhydride thereof.

More precisely, the present invention relates to
(1) an unsaturated group-containing polycarboxylic acid resin produced by reacting a compound represented by the following formula [I]:

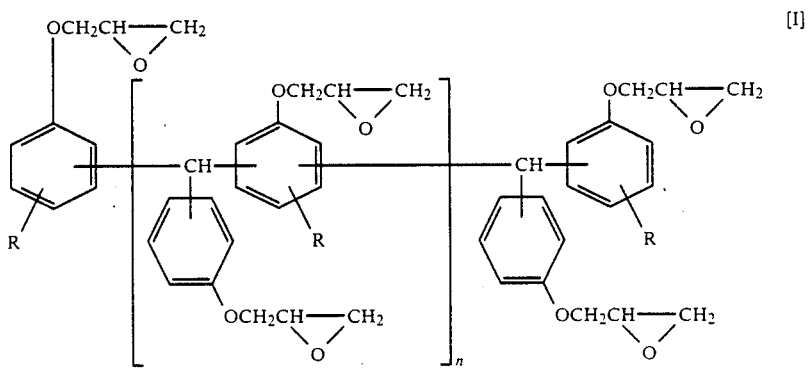

wherein R represents H or CH₃, and n represents 0 or an integer of not less than 1, preferably an integer of 0 to 15, more preferably an integer of 0 to 10, or a compound represented by the following formula [II]:

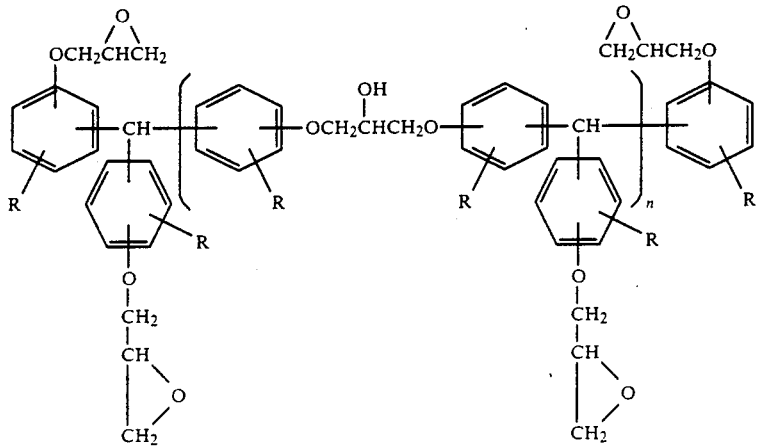

wherein R each represents H or CH₃, and n represents 0 or an integer of not less than 1, preferably an integer of 0 to 15, more preferably an integer of 0 to 10, with (meth)acrylic acid, and further reacting the reaction product with a polybasic carboxylic or an anhydride thereof, (2) a resin composition, in particular, a solder resist composition comprising an unsaturated group-containing polycarboxylic acid resin produced by reacting a compound represented by the formula [I] or [II] with (meth)acrylic acid, and further reacting the reaction product with a polybasic carboxylic acid or an anhydride thereof, and (3) a cured product of the resin or the resin composition.

DETAILED DESCRIPTION OF THE INVENTION

Figure 1:
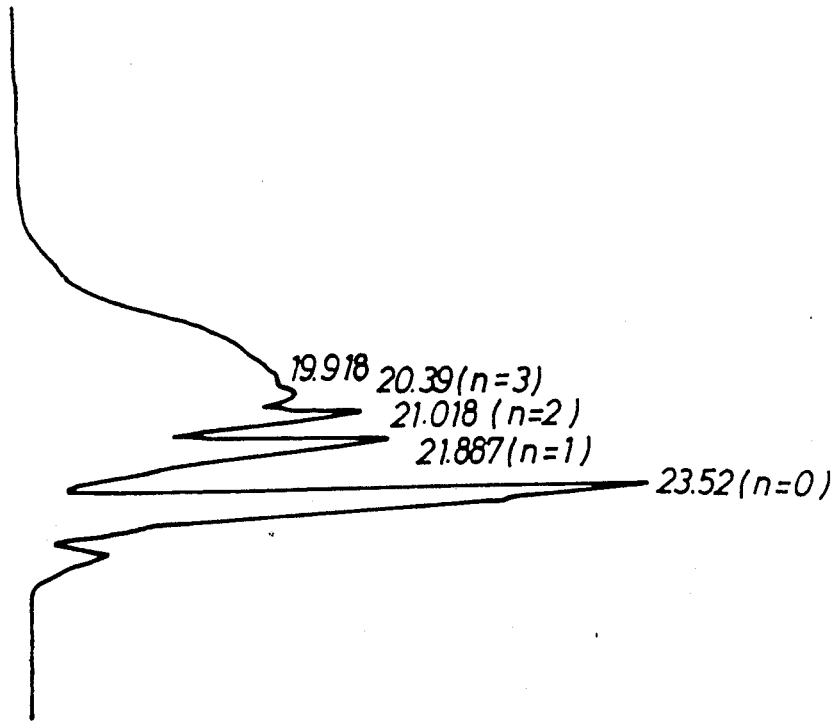
FIG. 1 and FIG. 2 are charts of gel permeation chromatography of each of mixed compound represented by the formula (I) obtained in Synthesis Examples 1 and 2, respectively.

The unsaturated group-containing polycarboxylic acid resin of the present invention is produced by reacting the compound represented by the formula [I] or [II] with (meth)acrylic acid (representing acrylic acid and/or methacrylic acid), and further reacting the reaction product with a polybasic carboxylic acid or an anhydride thereof.

The compound represented by the formula [I] is produced by reacting a condensate, which is a reaction product of a phenolic compound such as phenol, o-cresol, m-cresol and p-cresol with an aromatic aldehyde having a phenolic hydroxyl group such as hydroxybenzaldehyde and salicylaldehyde, with epihalohydrin. The compound represented by the formula (I) can be produced by a known method described in, for example, Japanese Patent Application Laid-Open (KOKAI) No. 57-141419 (U.S. Pat. No. 4,390,664).

An example of the compound represented by the formula (II) is a tris(hydroxyphenyl)methane-based epoxidized compound and TACTIX-742 (epoxy equivalent: 162, softening point: 55° C.) and XD-9053 (epoxy equivalent: 220, softening point: 85° C.) produced by The Dow Chemical Co. are commercially available.

The compounds represented by the formula (I) and (II) are usually obtained as a mixture of compounds having different degrees of condensation (n in the formula (I) and (II)). Such a mixture of the compound represented by the formula (I) or (II), also, can be used in the present invention without any problem.

The reaction of the compound represented by the formula (I) or (II) with (meth)acrylic acid is carried out by reacting preferably about 0.8 to 1.5 chemical equivalents, more preferably about 0.9 to 1.1 chemical equivalents of (meth)acrylic acid based on 1 chemical equivalent of the epoxy group in the compound represented by the formula (I) or (II). At the time of reaction, it is preferable to use a diluent, for example, a solvent such as methyl ethyl ketone, methyl isobutyl ketone, butyl acetate, ethyl cellosolve acetate, butyl cellosolve acetate, benzene, toluene and petroleum ether, and a reactive monomer such as carbitol (meth)acrylate, phenoxyethyl (meth)acrylate, pentaerythritol tri(meth)acrylate, tris(hydroxyethyl)isocyanurate di(meth)acrylate, tris(hydroxyethyl)isocyanurate tri(meth)acrylate, acryloylmorpholine, trimethylolpropane tri(meth)acrylate and dipentaerythritol poly(meth)acrylate. Further, it is preferable to use a catalyst to accelerate the reaction such as triethylamine, benzyldimethylamine, methyltriethylammonium chloride and triphenylstibine. The amount of catalyst used is 0.1 to 10 wt %, more preferably 1 to 5 wt % based on the reaction mixture. In order to prevent the polymerization during the reaction, a polymerization inhibitor such as methoquinone, hydroquinone and phenothiazine is preferably used. The amount of polymerization inhibitor used is 0.01 to 1 wt %, more preferably 0.05 to 0.5 wt % based on the reaction mixture. The reaction temperature is 60° to 150° C., more preferably 80° to 120° C.

Examples of polybasic carboxylic acid or an anhydride thereof include maleic acid, succinic acid, phthalic acid, tetrachlorophthalic acid, tetrabromophthalic acid, endomethylenetetrahydrophthalic acid, tetrahydrophthalic acid, hexahydrophthalic acid, trimellitic acid, pyromellitic acid etc. and anhydrides thereof. These acids or anhydrides may be used either singly or in the form of a mixture of any given ratio.

The reaction product of the compound represented by the formula [I] or [II] with (meth)acrylic acid obtained in the above-described manner is reacted with a polybasic carboxylic acid or an anhydride thereof by using 0.05 to 1.00 chemical equivalent of the acid or the anhydride thereof per one chemical equivalent of the hydroxyl group of the reaction product of the compound represented by the formula [I] or [II] with (meth)acrylic acid. The acid value (mg KOH/g) of the thus obtained reaction product is preferably about 30 to 150. The reaction temperature is 60° to 150° C., more preferably 80° to 120° C.

The amount of the unsaturated group-containing polycarboxylic acid resin contained in the resin composition of the present invention is preferably 10 to 100 wt %, more preferably 20 to 90 wt % based on the resin composition.

The resin composition of the present invention may further contain an epoxy compound such as a phenol-novolak type epoxy resin, cresol-novolak type epoxy resin and bisphenol type epoxy resin, an epoxy acrylate which is a reaction product of the above epoxy compound with (meth)acrylic acid, the above-described reactive monomer and the like. These additives may be used either singly or in the form of a mixture of any given ratio, and the preferable amount used is 0 to 90 wt %, more preferably 10 to 80 wt % based on the resin composition.

In order to cure the resin composition of the present invention, electron rays, ultraviolet rays or heat may be adopted. Among these, an ultra-violet-curing method or a heat-curing method is preferable.

In the case of curing the resin composition with ultraviolet rays, a photopolymerization initiator is preferably added thereto. As the photopolymerization initiator, any known photopolymerization initiator may be used, but one having a good storage stability after mixing into the resin composition is preferable. Examples of such a photopolymerization initiator include 2-chlorothioxanthone, 2,4-diethylthioxanthone, 2-isopropylthioxanthone, benzyl dimethyl ketal, 2-ethylanthraquinone, isoamyl N,N-dimethyl aminobenzoate, ethyl N,N-dimethyl aminobenzoate, 2-hydroxy-2-methylpropiophenone, 4'-isopropyl-2-hydroxy-2-methylpropiophenone, etc. These photopolymerization initiators may be used singly or in the form of a mixture of any given ratio. Among these, 2,4-diethylthioxanthone and 2-isopropylthioxanthone are preferable. The amount of photopolymerization initiator used is 0.1 to 20 wt %, preferably 1 to 10 wt % of the resin composition.

In the case of adding an epoxy group-containing compound to the resin composition of the present invention, it is preferable to use a cationic photopolymerization catalyst such as diphenyliodonium hexafluoroantimonate, triphenylsulfonium hexafluorophosphate, triphenylsulfonium hexafluoroantimonate, etc. as a curing agent. For example, SP-150 and SP-170 produced by Asahi Denka Kogyo K.K. and Irgacure 261 produced by Ciba Geigy Ltd. are commercially available. The amount of curing agent used is 0.01 to 1.0 wt %, preferably 0.02 to 0.2 wt % of the resin composition.

It is also possible to further add to the resin composition of the present invention various additives, for example, an extender pigment such as talc, silica, alumina, barium sulfate and magnesium oxide, a thixotropic agent such as aerosil, a leveling agent such as silicone, fluorine acrylic copolymer, a defoaming agent and a coloring agent. It is also possible to add the above-described solvent in order to facilitate the handling of the resin composition of the present invention.

The resin composition of the present invention is useful especially as a solder resist composition but is also usable as an insulating material, impregnant, surface coating material, paints, adhesive, etc.

The present invention will be explained more in detail with reference to the following nonlimitative examples. "Part" in the examples represents a part by weight.

[Synthesis of a compound represented by the formula [I]]

Synthesis Example 1:

A mixture of 122 g (1 mol) of salicylaldehyde, 376 g (4 mol) of phenol and 3.8 g of p-toluenesulfonic acid was reacted at 90° to 100° C. for 2 hours and further at 120° to 150° C. for two hours. After the completion of the reaction, the product was dissolved by adding 500 g of methyl isobutyl ketone thereto. The solution was washed with water repeatedly until the water layer became neutral. The organic layer was concentrated under a reduced pressure to obtain a reddish brown solid (condensate). The softening temperature of the product was 130° C. and the hydroxyl group equivalent (g/mol) was 98. Then, into a mixture of 98 g of the condensate of salicylaldehyde and phenol and 650 g of epichlorohydrin, 87.5 g of 48% aqueous solution of NaOH was gradually added dropwise. During the dropwise addition, the reaction temperature was 60° C. and the pressure was 100 to 150 mmHg, and the water produced during the reaction and the water from the aqueous solution of sodium hydroxide were continuously removed the epichlorohydrin azeotrope while returning epichlorohydrin to the system.

The unreacted epichlorohydrin was collected under a reduced pressure and 500 g of methyl isobutyl ketone was added to the system, then, washed with water until the water layer became neutral. The organic layer was concentrated under a reduced pressure to obtain a light yellow solid (epoxidized compound). The softening temperature of the epoxidized compound was 70° C. and the epoxy equivalent was 164. When the epoxidized compound was subjected to GPC (gel permeation chromatography)analysis by using tetrahydrofuran as a solvent, a molecular-weight distribution curve shown in FIG. 1 was obtained. The conditions for analysis were as follows:

GPC apparatus: Shimazu Seisakusho Ltd.
Column: Toyo Soda Manufacturing Co., Ltd. TSKGEL, G3000 HXL+G2000 HXL (two columns),
Solvent: Tetrahydrofuran,
Detection: UV (254 nm).

The retention time of a compound represented by the formula [I] wherein n=1 is 21.9 minutes.

Synthesis Example 2:

A reddish brown solid (condensate) was obtained by the reaction carried out in the same way as in Synthesis Example 1 except that 432 g (4 mol) of o-cresol was used in place of phenol. The softening temperature of the condensate was 131° C. and the hydroxyl group equivalent was 106.

Figure 2:
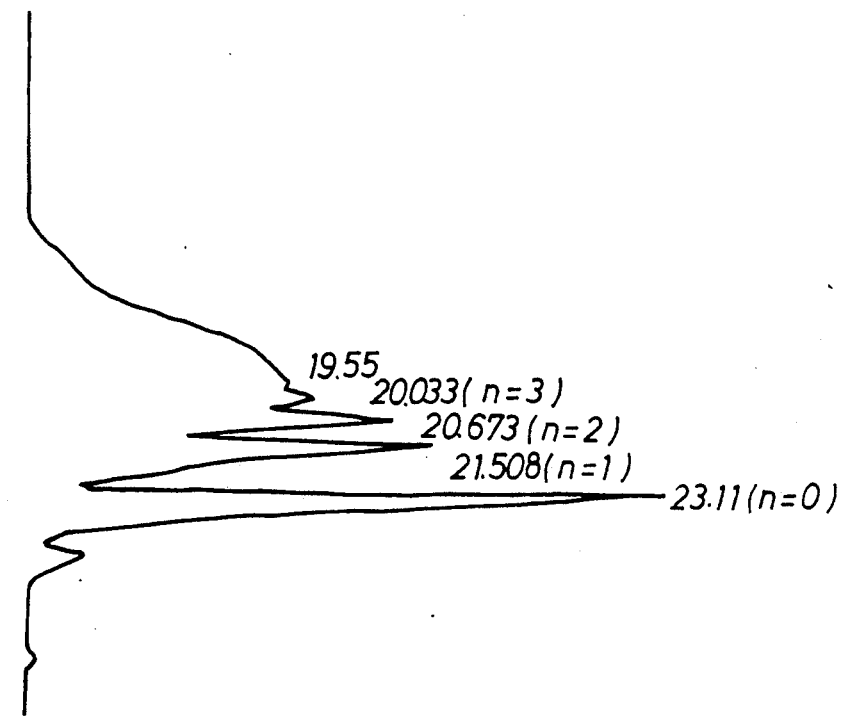

Thereafter, a yellow solid (epoxidized compound) was obtained by the reaction carried out in the same way as in Synthesis Example 1 except that 106 g of the condensate of salicylaldehyde and o-cresol obtained above was used in place of the condensate of salicylaldehyde and phenol. The softening temperature of the epoxidized compound was 75° C. and the epoxy equivalent was 180. A molecular-weight distribution curve obtained by GPC analysis (the conditions for analysis were the same as in Synthesis Example 1) is shown in FIG. 2.

The retention time of a compound represented by the formula [I] wherein n=1 is 21.5 minutes. [Examples of synthesis of unsaturated group-containing polycarboxylic acid resin]

EXAMPLE 1

A mixture of 1640 parts of the epoxidized compound obtained from the reaction of the condensate of salicylaldehyde and phenol with epichlorohydrin in Synthesis Example 1, 720 parts of acrylic acid, 1.0 part of methyl hydroquinone, 25 parts of triphenylstibine and 1194 parts of butyl cellosolve acetate was heated to 95° C. and reacted for 30 hours. After 400.5 parts of phthalic anhydride was added thereto, reaction was further carried out at 90° C. for 20 hours to obtain a product having a viscosity of 4300 CPS (25° C.) and an acid value (of the components except the solvent) of 55.0 mg KOH/g.

EXAMPLE 2

The same reaction as in Example 1 was carried out except for using 383.3 parts of maleic anhydride in place of phthalic anhydride and 1186.8 parts of butyl cellosolve acetate in place of 1194 parts thereof to obtain a product having a viscosity of 4650 CPS (25° C.) and an acid value (of the components except the solvent) of 80 mg KOH/g.

EXAMPLE 3

A mixture of 1800 parts of the epoxidized compound obtained from the reaction of a condensate of salicylaldehyde and o-cresol with epichlorohydrin in Synthesis Example 2, 720 parts of acrylic acid, 1.5 parts of methyl hydroquinone, 30 parts of triphenylstibine and 1450 parts of butyl cellosolve acetate was heated to 95° C. and reacted for 30 hours. After 833.8 parts of tetrahydrophthalic anhydride was added thereto, reaction was further carried out at 90° C. for 20 hours to obtain a product having a viscosity of 20500 CPS (25° C.) and an acid value (of the components except the solvent) of 93 mg KOH/g.

EXAMPLE 4

The same reaction as in Example 3 was carried out except for using 1002 parts of hexahydrophthalic anhydride in place of tetrahydrophthalic anhydride and 1553 parts of butyl cellosolve acetate in place of 1450 parts thereof to obtain a product having a viscosity of 33500 CPS (25° C.) and an acid value (of the components except the solvent) of 105 mg KOH/g.

EXAMPLE 5

A mixture of 1640 parts of the epoxidized compound obtained from the reaction of a condensate of salicylaldehyde and phenol with epichlorohydrin in Synthesis Example 1, 860 parts of methacrylic acid, 1.0 part of methyl hydroquinone, 10 parts of methyltriethylammonium chloride and 1249 parts of butyl cellosolve acetate was heated to 95° C. and reacted for 30 hours. After 424 parts of phthalic anhydride was added thereto, reaction was further carried out at 90° C. for 20 hours to obtain a product having a viscosity of 5100 CPS (25° C.) and an acid value (of the components except the solvent) of 55 mg KOH/g.

EXAMPLE 6

A mixture of 1620 parts of a polyfunctional epoxy compound of tris(hydroxyphenyl)methane base (TACTIX-742, produced by The Dow Chemical Co., softening point: 55° C.) having an epoxy equivalent of 162, 720 parts of acrylic acid, 1.0 part of methylhydroquinone, 25 parts of triphenylstibine and 1166 parts of butyl cellosolve acetate was heated to 95° C. and reacted for 30 hours. After 355.4 parts of phthalic anhydride was added thereto, reaction was carried out at 90° C. for 20 hours to obtain a product having a viscosity of 2800 CPS (25° C.) and an acid value (of the components except the solvent) of 50.0 mg KOH/g.

EXAMPLE 7

A mixture of 1620 parts of a polyfunctional epoxy compound of tris(hydroxyphenyl)methane base (TACTIX-742, produced by The Dow Chemical Co., softening point: 55° C.) having an epoxy equivalent of 162, 720 parts of acrylic acid, 1.0 part of methylhydroquinone, 25 parts of triphenylstibine and 1175 parts of butyl cellosolve acetate was heated to 95° C. and reacted for 30 hours. After 374.5 parts of maleic anhydride was added thereto, reaction was further carried out at 90° C. for 20 hours to obtain a product having a viscosity of 3100 CPS (25° C.) and an acid value (of the components, except the solvent) of 79 mg KOH/g.

EXAMPLE 8

A mixture of 2200 parts of a polyfunctional epoxy compound of tris(hydroxyphenyl)methane base (XD-9053, produced by The Dow Chemical Co., softening point: 85° C.) having an epoxy equivalent of 220, 720 parts of acrylic acid, 1.5 parts of methylhydroquinone, 30 parts of triphenylstibine and 1661 parts of butyl cellosolve acetate was heated to 95° C. and reacted for 30 hours. After 925 parts of tetrahydrophthalic anhydride was added thereto, reaction was further carried out at 90° C. for 20 hours to obtain a product having a viscosity of 24500 CPS (25° C.) and an acid value (of the components except the solvent) of 90 mg KOH/g.

EXAMPLE 9

A mixture of 2200 parts of a polyfunctional epoxy compound of tris(hydroxyphenyl)methane base (XD-9053, produced by The Dow Chemical Co., softening point: 85° C.) having an epoxy equivalent of 220, 720 parts of acrylic acid, 1.5 parts of methylhydroquinone, 30 parts of triphenylstibine and 1749 parts of butyl cellosolve acetate was heated to 95° C. and reacted for 30 hours. After 1130 parts of hexahydrophthalic anhydride was added thereto, reaction was further carried out at 90° C. for 20 hours to obtain a product having a viscosity of 41000 CPS (25° C.) and an acid value (of the components except the solvent) of 103 mg KOH/g.

EXAMPLE 10

A mixture of 1620 parts of a polyfunctional epoxy compound of tris(hydroxyphenyl)methane base (TACTIX-742, produced by The Dow Chemical Co., softening point: 55° C.) having an epoxy equivalent of 162, 860 parts of methacrylic acid, 1.0 part of methylhydroquinone, 10 parts of methyltriethylammonium chloride and 1226 parts of butyl cellosolve acetate was heated to 95° C. and reacted for 30 hours. After 377 parts of phthalic anhydride was added thereto, reaction was further carried out at 90° C. for 20 hours to obtain a product having a viscosity of 2950 CPS (25° C.) and an acid value (of the components except the solvent) of 50 mg KOH/g.

APPLICATION EXAMPLES 11 to 15

Each of solder resist compositions having a composition shown in Table 1 was prepared. Each composition was applied to a copper through-hole board for printing circuit by screen printing to a thickness of 20 to 100 μm. After the coated film was dried at 70° C. for 60 minutes, a negative film was placed on the board in direct contact with the coated film or without any contact with the coated film. The board was then irradiated with ultraviolet rays by using a 5-KW ultra-high pressure mercury vapor lamp, and the unirradiated portion of the coating film was dissolved and removed by an aqueous alkali solution such as 1.5% aqueous solution of $Na_2CO_3$. Thereafter, the board was heated and cured at 150° C. for 30 minutes in a hot-air drier to obtain each sample of printed circuit board. Various properties of the samples obtained were tested. The results are shown in Table 1.

[Storage stability]

A resin composition was allowed to stand at 30° C. and the days passed until the composition was thickened or gelated were counted.

[Solubility]

After the irradiation with ultraviolet rays by using a 5-KW ultra-high pressure mercury vapor lamp, the unirradiated portion of the coating film was dissolved and removed by 1.5% aqueous alkali solution of $Na_2CO_3$ at 30° C. to judge the solubility.

O . . . Dissolving speed is high.

x . . . Not dissolved or dissolving speed is very low.

[Soldering resistance]

The state of a coating film after immersing a sample board in a molten solder of 260° C. for 2 minutes was judged.

O . . . Nothing abnormal in the external appearance of the coated film.

x . . . Produced blister, melted or peeled off

[Adhesion]

Cellophane tapes were adhered to 100 squares of 1 mm × 1 mm on the coated film of a sample and were peeled off to evaluate the adhesion.

(Number of squares not peeled off)/(Number of squares initially presented on sample)

[Insulation resistance]

A sample was allowed to stand for 240 hours in an atmosphere of 80° C. and 95% RH and the insulation resistance of the coated film was measured.

The results are shown in Table 1.

TABLE 1

|  | Application Example | | | | |
|---|---|---|---|---|---|
|  | 11 | 12 | 13 | 14 | 15 |
| Resin obtained in Example 1 | 121 |  |  |  | 90 |
| Resin obtained in Example 2 |  | 100 |  |  |  |
| Resin obtained in Example 3 |  |  | 110 |  |  |
| Resin obtained in Example 4 |  |  |  | 70 |  |
| Resin obtained in Example 5 |  |  |  |  | 31 |
| Epoxy acrylate *2 |  | 14 | 16.4 | 14 |  |
| EPPN-201 *1 | 5.0 | 10 |  | 10 | 5.0 |
| Pentaerythritol triacrylate | 1.8 |  |  | 5 | 1.8 |
| Tris(hydroxyethyl)isocyanurate diacrylate |  |  | 1.5 | 5 | 5 |
| SP-170 *3 | 0.2 | 0.2 | 0.2 | 0.2 | 0.2 |
| DETX *4 | 4 | 4 | 4 | 4 | 4 |
| EPA *5 | 4 | 4 | 4 | 4 | 4 |
| Butyl cellosolve acetate | 10 | 15 | — | 10 | 10 |
| Talc | 40 | 40 | 40 | 40 | 40 |
| Storage stability | Not less than 10 days | | | | |
| Solubility | o | o | o | o | o |
| Soldering resistance | o | o | o | o | o |
| Adhesion | 100/100 | 100/100 | 100/100 | 100/100 | 100/100 |
| Insulation resistance (Ω) | $2.5 \times 10^{12}$ | $1 \times 10^{12}$ | $1.3 \times 10^{12}$ | $2.1 \times 10^{12}$ | $1.1 \times 10^{12}$ |

Note:
*1 EPPN-201: Phenol.Novolak type epoxy resin (produced by Nippon Kayaku K.K.)
*2 Epoxy acrylate: Obtained by reacting 0.5 chemical equivalent of acrylic acid per chemical equivalent of epoxy group of EPPN-201 and diluting the reaction product with 30% butyl cellosolve acetate
*3 SP-170: Produced by Asahi Denka Kogyo K.K., cationic photo- polymerization catalyst
*4 DETX: Produced by Nippon Kayaku K.K., photopolymer- ization initiator, 2,4-diethylthioxanthone
*5 EPA: Produced by Nippon Kayaku K.K., photopolymerization accelerator, ethyl N,N-dimethylaminobenzoate.

APPLICATION EXAMPLES 16 TO 20

Each of solder resist composition having a composition shown in Table 2 was prepared by using an unsaturated group-containing polycarboxylic acid resin obtained in each of Examples 6 to 10 and various property tests were carried out in the same way as in Application Examples 11 to 15. The results are shown in Table 2.

TABLE 2

|  | Application Example | | | | |
|---|---|---|---|---|---|
|  | 16 | 17 | 18 | 19 | 20 |
| Resin obtained in Example 6 | 114 |  |  |  | 80 |
| Resin obtained in Example 7 |  | 100 |  |  |  |
| Resin obtained in Example 8 |  |  | 121 |  |  |
| Resin obtained in Example 9 |  |  |  | 71 |  |
| Resin obtained in Example 10 |  |  |  |  | 34 |
| EPPN-201 *1 | 10 | 10 | 5.0 | 10 | 10 |
| Epoxy acrylate *2 |  | 14 |  |  |  |
| Pentaerythritol triacrylate |  |  | 1.8 | 30 |  |
| Tris(hydroxyethyl)isocyanurate diacrylate |  |  |  | 10 |  |
| SP-170 *3 | 0.2 | 0.2 | 0.2 | 0.2 | 0.2 |
| DETX *4 | 4 | 4 | 4 | 4 | 4 |
| EPA *5 | 4 | 4 | 4 | 4 | 4 |
| Butyl cellosolve acetate | 15 | 15 | 10 | 10 | 15 |
| Talc | 40 | 40 | 40 | 40 | 40 |
| Storage stability | Not less than 10 days | | | | |
| Solubility | o | o | o | o | o |
| Soldering resistance | o | o | o | o | o |
| Adhesion | 100/100 | 100/100 | 100/100 | 100/100 | 100/100 |
| Insulation resistance (Ω) | $3 \times 10^{12}$ | $1 \times 10^{12}$ | $7 \times 10^{11}$ | $5 \times 10^{11}$ | $2.5 \times 10^{12}$ |

Note: *1 to *5 represent the same as in TABLE 1

What is claimed is:

1. An unsaturated group-containing polycarboxylic acid resin produced by reacting an epoxidized compound of a condensate of a phenolic compound and an aromatic aldehyde having a phenolic hydroxyl group with (meth)acrylic acid, and further reacting the reaction product with polybasic carboxylic acid or an anhydride thereof.

2. An unsaturated group-containing polycarboxylic acid resin produced by reacting a compound represented by the following formula [I]:

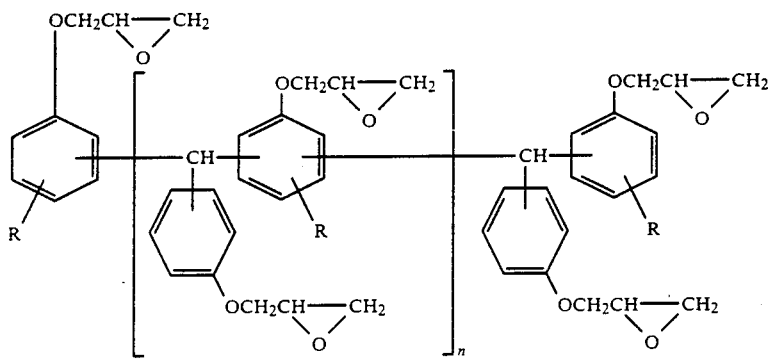

wherein R represents H or CH$_3$, and n represents 0 or an integer of not less than 1, with (meth)acrylic acid, and further reacting the reaction product with polybasic carboxylic acid or an anhydride thereof.

3. An unsaturated group-containing polycarboxylic acid resin produced by reacting a compound represented by the following formula [II]:

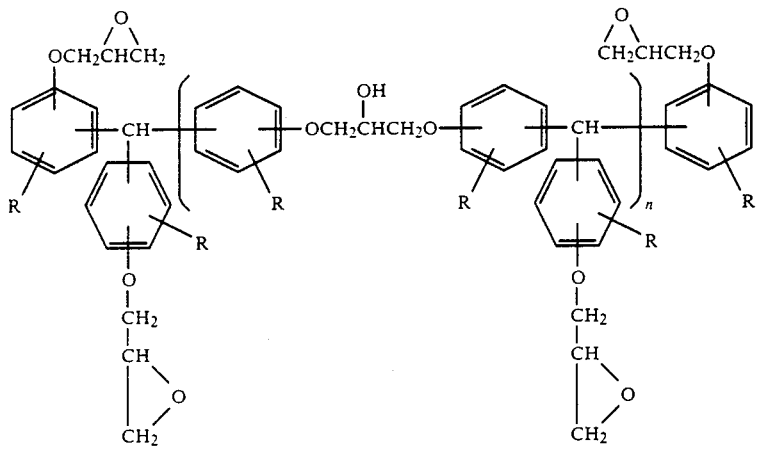

wherein R each represents H or CH$_3$, and n represents 0 or an integer of not less than 1,
with (meth)acrylic acid, and further reacting the reaction product with polybasic carboxylic acid or an anhydride thereof.

4. The resin according to any one of claims 1, 2 and 3, wherein the polybasic carboxylic acid or an anhydride thereof is at least one member selected from the group consisting of maleic acid, succinic acid, phthalic acid, tetrachlorophthalic acid, tetrabromophthalic acid, endomethylenetetrahydrophthalic acid, tetrahydrophthalic acid, hexahydrophthalic acid, trimellitic acid, pyromellitic acid and anhydrides thereof.

5. A resin composition comprising the unsaturated group-containing polycarboxylic acid resin according to any one of claims 1, 2 and 3.

6. A resin composition comprising (A) the unsaturated group-containing polycarboxylic acid resin according to any one of claims 1, 2 and 3, and (B) at least one selected from the group consisting of epoxy compounds, epoxy acrylates which are reaction products of the epoxy compound with (meth)acrylic acid, carbitol (meth)acrylate, phenoxyethyl (meth)acrylate, pentaerythritol tri(meth)acrylate, tris(hydroxyethyl) isocyanurate di(meth)acrylate, tri(hydroxyethyl) isocyanurate tri(meth)acrylate, acryloylmorphine, trimethylolpropane tri(meth)acrylate and dipentaerythritol poly (meth)acrylate.

7. The resin composition according to claim 6, wherein said ingredient (A) is an unsaturated group-containing polycarboxylic acid resin produced by using at least one selected from the group consisting of maleic acid, succinic acid, phthalic acid, tetrachlorophthalic acid, tetrabromophthalic acid, endomethylenetetrahydrophthalic acid, tetrahydrophthalic acid, hexahydrophthalic acid, trimellitic acid, pyromellitic acid and anhydrides thereof as a polybasic carboxylic acid or an anhydride thereof.

8. The resin composition according to claim 6, wherein the weight ratio of (A) and (B) is 10 to 100:0 to 90.

9. The resin composition according to claim 6, wherein the weight of (A) and (B) is 20 to 90:10 to 80.

10. The resin composition according to claim 5 which is used for a solder resist.

11. The resin composition according to claim 6 which is used for a solder resist.

12. The resin composition according to claim 7 which is used for a solder resist.

13. The resin composition according to claim 8 which is used for a solder resist.

14. The resin composition according to claim 9 which is used for a solder resist.

15. A cured product produced by curing the resin according to any one of claims 1, 2 and 3.

16. A cured product produced by curing the resin according to claim 4.

17. A cured product produced by curing the resin composition according to claim 5.

18. A cured product produced by curing the resin composition according to claim 6.

19. A cured product produced by curing the resin composition according to claim 7.

20. A cured product produced by curing the resin composition according to claim 8.

21. A cured product produced by curing the resin composition according to claim 9.

22. The resin composition according to claim 7, wherein the weight ratio of (A) to (B) is 10 to 100:0 to 90.

23. The resin composition according to claim 7, wherein the weight ratio of (A) to (B) is 20 to 90:10 to 80.

24. The resin composition according to claim 22 which is used for a solder resist.

25. The resin composition according to claim 23 which is used for a solder resist.

26. A cured product produced by curing the resin composition according to claim 22.

27. A cured product produced by curing the resin composition according to claim 23.

* * * * *